(12) United States Patent
Silvernail et al.

(10) Patent No.: US 6,614,057 B2
(45) Date of Patent: Sep. 2, 2003

(54) SEALED ORGANIC OPTOELECTRONIC STRUCTURES

(75) Inventors: Jeffrey Alan Silvernail, Yardley, PA (US); Kenneth L. Urbanik, South River, NJ (US)

(73) Assignee: Universal Display Corporation, Ewing, NJ (US)

( * ) Notice: Subject to any disclaimer, the term of this patent is extended or adjusted under 35 U.S.C. 154(b) by 40 days.

(21) Appl. No.: 09/778,346

(22) Filed: Feb. 7, 2001

(65) Prior Publication Data

US 2002/0125484 A1 Sep. 12, 2002

(51) Int. Cl.[7] ............................................... H01L 29/02
(52) U.S. Cl. .......................................... 257/99; 257/100
(58) Field of Search ............................ 257/79, 100, 40, 257/99; 313/504, 506, 512; 428/76, 690, 917; 264/272.17

(56) References Cited

U.S. PATENT DOCUMENTS

| | | | |
|---|---|---|---|
| 4,357,557 A | 11/1982 | Inohara et al. | 313/509 |
| 5,051,654 A | 9/1991 | Nativi et al. | 313/506 |
| 5,707,745 A | 1/1998 | Forrest et al. | 428/432 |
| 5,757,126 A | 5/1998 | Harvey, III et al. | 313/506 |
| 5,771,562 A | 6/1998 | Harvey, III et al. | 29/592.1 |
| 5,882,761 A | 3/1999 | Kawami et al. | 428/69 |
| 5,952,778 A | 9/1999 | Haskal et al. | 313/504 |
| 5,962,962 A | 10/1999 | Fujita et al. | 313/412 |
| 6,083,313 A | 7/2000 | Venkatraman et al. | 106/287.14 |
| 6,146,225 A | 11/2000 | Sheats et al. | 445/24 |
| 6,268,071 B1 * | 7/2001 | Yasukawa et al. | 428/690 |
| 2002/0068143 A1 | 6/2002 | Silvernail et al. | 428/76 |

FOREIGN PATENT DOCUMENTS

| | | | |
|---|---|---|---|
| EP | 0 977 469 A2 | 2/2000 | H05B/33/04 |
| JP | 07169569 | 7/1995 | H05B/33/04 |
| JP | 09153395 | 6/1997 | H05B/33/22 |
| WO | WO 99/02277 | 1/1999 | B05D/5/12 |
| WO | WO 99/39393 | 8/1999 | H01L/51/20 |
| WO | WO 00/26973 | 5/2000 | H01L/51/20 |
| WO | WO 00/36665 | 6/2000 | H01L/51/20 |
| WO | WO 00/65879 | 11/2000 | H05B/33/12 |

* cited by examiner

Primary Examiner—Sara Crane
(74) Attorney, Agent, or Firm—Mayer Fortkort & Williams, PC; David B. Bonham, Esq.

(57) ABSTRACT

An organic optoelectronic device structure is provided. The structure comprises the following: (a) an organic optoelectronic device selected from an organic light emitting diode, an organic electrochromic display, an organic photovoltaic device and an organic thin film transistor; (b) first and second barrier layers, at least one of the first and second barrier layers permitting transmission of light between the an outer environment and the organic optoelectronic device; (c) a sealing region disposed between the first and second barrier layers, the sealing region cooperating with the first and second barrier layers to enclose the optoelectronic device and restrict transmission of water and oxygen from an outer environment to the optoelectronic device, the sealing region also having at least one associated material that is harmful to the optoelectronic device; and (d) a blocking region disposed between the first and second barrier layers and disposed between the sealing region and the optoelectronic device, the blocking region restricting transmission of the at least one associated material from the sealing region to the optoelectronic device.

28 Claims, 2 Drawing Sheets

SEALED ORGANIC OPTOELECTRONIC STRUCTURES

FIELD OF THE INVENTION

The present invention relates to structures that protect organic optoelectronic devices from species in the surrounding environment.

BACKGROUND OF THE INVENTION

Organic optoelectronic devices, including circuits, such as organic light emitting diodes, organic electrochromic displays, organic photovoltaic devices and organic thin film transistors, are known in the art and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and relatively easy and inexpensive to fabricate. Also, OLEDs readily lend themselves to applications requiring a wide variety of colors and to applications that concern large-area devices. In general, two-dimensional OLED arrays for imaging applications are known in the art and are typically composed of a plurality of OLEDs (one or more of which forms a pixel) arranged in rows and columns. Each individual OLED in the array is typically constructed with a first transparent anode (such as ITO), an organic electroluminescent layer on the first electrode, and a metallic cathode on the organic electroluminescent medium. Other OLED architectures are also known in the art such as transparent OLEDs (transparent cathode contact), and inverted OLEDs. Substrate materials may include glass, plastic, metal foil, silicon wafers, etc.

In forming an OLED, a layer of reactive metal is typically utilized as the cathode to ensure efficient electron injection and low operating voltages. However, reactive metals and their interface with the organic material are susceptible to oxygen and moisture, which can severely limit the lifetime of the devices. Moisture and oxygen are also known to produce other deleterious effects. For example, moisture and oxygen are known to increase "dark spot areas" in connection with OLEDs. Components of various other organic optoelectronic devices (e.g., organic electrochromic displays, organic photovoltaic devices and organic thin film transistors) are likewise susceptible to attack from exterior environmental species, including water and oxygen.

SUMMARY OF THE INVENTION

The above and other challenges are addressed by the present invention.

According to an embodiment of the present invention, an organic optoelectronic device structure is provided which comprises the following: (a) an organic optoelectronic device selected from an organic light emitting diode, an organic electrochromic display, an organic photovoltaic device and an organic thin film transistor; (b) first and second barrier layers, at least one of the first and second barrier layers permitting transmission of light between the an outer environment and the organic optoelectronic device; (c) a sealing region disposed between the first and second barrier layers, the sealing region cooperating with the first and second barrier layers to enclose the optoelectronic device and restrict transmission of water and oxygen from an outer environment to the optoelectronic device, the sealing region also having at least one associated material that is harmful to the optoelectronic device; and (d) a blocking region that is disposed between the first and second barrier layers and is also disposed between the sealing region and the optoelectronic device, the blocking region restricting transmission of the at least one associated material from the sealing region to the optoelectronic device.

Preferably, the sealing region is a material that undergoes a fluid-to-solid phase transformation. More preferably, the sealing region is selected from low viscosity epoxies, solders and two-part epoxies.

Preferred blocking regions are curable liquid adhesive and solid adhesive compositions. More preferred are thermally curable epoxies, ultraviolet-curable epoxies and two-sided adhesive tapes.

The first and second barrier layers are preferably comprise (a) glass, (b) metal, (c) silicon, and/or (d) a combination of a polymer substrate sub-layer with a plurality of cooperative barrier sub-layers disposed on the polymer substrate sub-layer. In the latter instance, the cooperative barrier sub-layers preferably comprise one or more planarizing sub-layers and one or more high-density sub-layers. More preferably, the cooperative barrier sub-layers comprise an alternating series of two or more planarizing sub-layers and two or more high-density sub-layers.

One advantage of the present invention is that organic optoelectronic structures are produced, which structures are protected by an effective barrier between the organic optoelectronic device and the ambient atmosphere, reducing the adverse effects of chemical species in the ambient atmosphere, such as moisture and oxygen.

Another advantage of the present invention is that sealing compositions having associated materials that adversely affect organic optoelectronic device performance can nonetheless be utilized in the construction of organic optoelectronic structures.

These and other embodiments and advantages of the present invention will become readily apparent to those of ordinary skill in the art upon review of the disclosure to follow.

As is typically the case with such figures, the above are simplified schematic representations, and the actual structures will differ in numerous respects including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers.

Figure 1A:
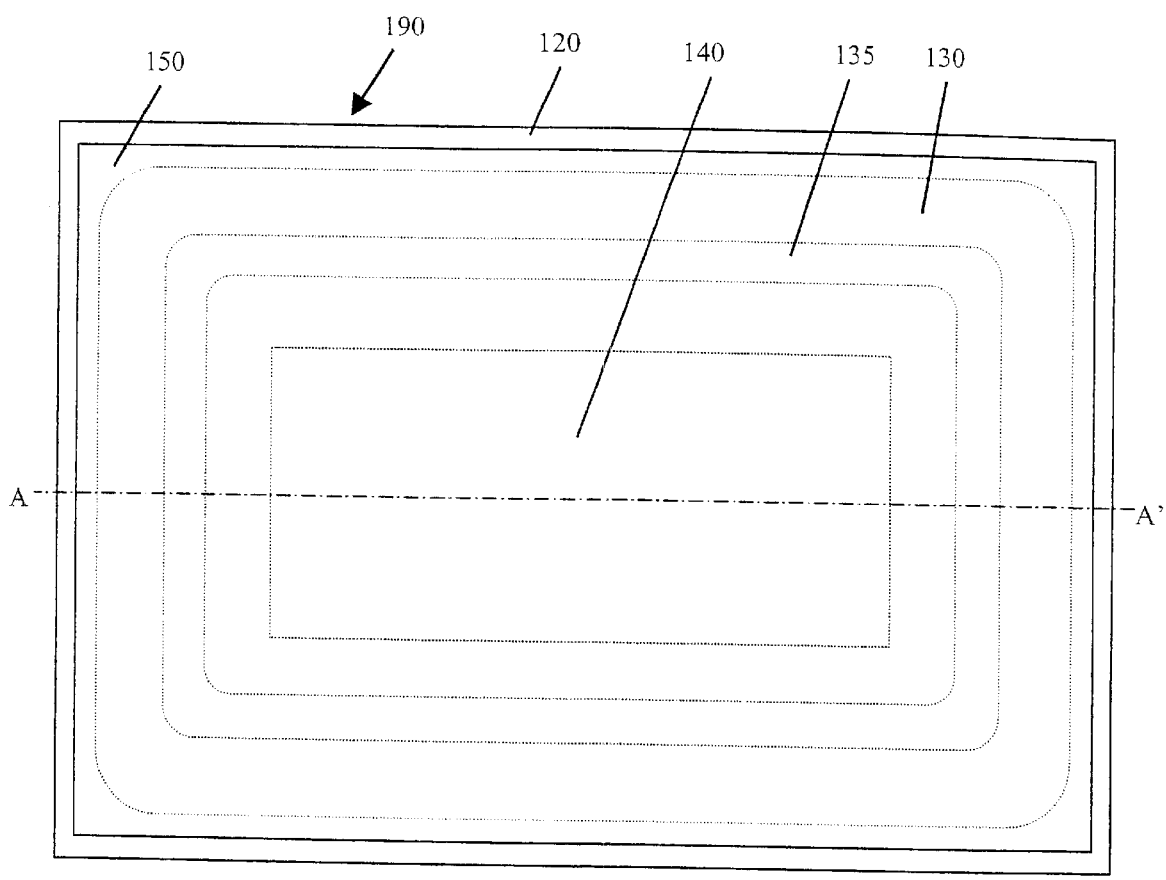
FIG. 1A is a plan view of an OLED structure in accordance with an embodiment of the present invention.
Figure 1B:
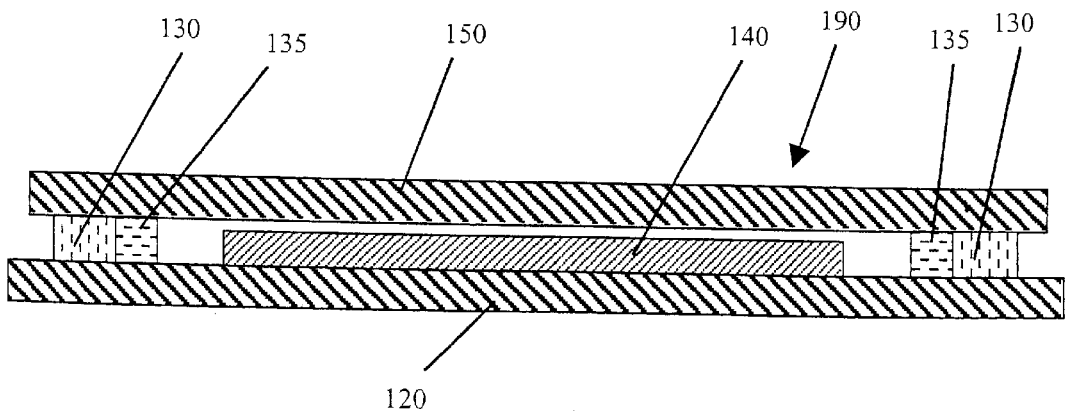
FIG. 1B is a cross-sectional view of the OLED structure of FIG. 1A taken along line A–A'.

FIG. 1A is a plan view of an OLED structure 190 in accordance with an embodiment of the present invention. FIG. 1B is a cross-sectional view of the OLED structure 190 of FIG. 1A taken along line A–A'. The OLED structure 190 includes an OLED 140 situated on a first barrier layer 120. Over the OLED is a second barrier layer 150. Preferably, the second barrier layer 150 is not in contact with the OLED 140 as shown. A blocking region 135 and a sealing region 130 are disposed between the first barrier layer 120 and the second barrier layer 150. The blocking region 135 encircles the OLED 140, and cooperates with the first barrier layer 120 and the second barrier layer 150 to surround the OLED. Similarly, the sealing region 130 encircles the OLED 140 and blocking region 135, and cooperates with the first barrier layer 120 and the second barrier layer 150 to surround the OLED 140 and blocking region 135 preferably with no gaps between regions 130 and 135.

The sealing region 130 is preferably selected both to provide a barrier to adverse exterior environmental species, including water and oxygen, and to provide good adhesion with the first and second barrier layers 120, 150. Preferred materials for the sealing region 130 include materials that undergo a fluid-to-solid phase transformation, which enhances the seal with the barrier layers 120, 150. Examples include solders, which undergo a fluid-to-solid transformation upon cooling, and low permeability liquid adhesives, which undergo a fluid-to-solid transformation upon curing. Preferred solders include indium alloy solders. Preferred low-permeability liquid adhesives include two-part epoxies such as Torr Seal epoxy resin available from Varian Vacuum Technologies.

Many compositions that are desirable for use as sealing region 130, however, have associated materials (e.g., precursor and/or by-product materials), which can adversely affect the OLED 140 (i.e., they are harmful to the OLED 140 in that they reduce the lifetime and/or efficiency of the OLED 140). Such associated materials can arise in connection with the sealing region 130 either before, during or after sealing region 130 formation. As one example, flux is typically used with solder to improve adhesion during application, which then can enter the active region of the device if not blocked. As another example, certain low-viscosity epoxies result in wicking of uncured liquid, which if unblocked, can enter the active region. Also, certain two-part epoxies can result in significant off-gassing of harmful materials during curing which can enter the active region. Unfortunately, these and other materials associated with the sealing region 130 are harmful to OLEDs 140 (as well as other optoelectronic devices) in the active area.

Hence, in accordance with the present invention, a blocking region 135 is provided to protect the OLED 140 from contact with materials associated with the sealing region 130 that are harmful to the OLED 140. Preferred compositions for the blocking region 135 include curable liquid adhesives, such as ultravioletcurable epoxy materials and thermally curable epoxy materials. More preferred compositions are ultraviolet curable, single-part epoxies such as Epotek OG 159. When formed from such materials, the thickness of the blocking region 135 typically ranges from 25 to 100 microns. Other preferred compositions for the blocking region 135 include solid adhesive compositions such as tapes, which are effective in preventing wicking of liquid materials, for example. Preferred adhesive tapes are two-sided plastic adhesive tapes, such as Scotch® double-sided tape.

In many instances, the composition selected for use as blocking region 135 is also useful in adhering the first and second barrier layers 120,150 to one another during the formation of the sealing region 130. Moreover, like the sealing region 130, the blocking region 135 can also act as a barrier to adverse exterior environmental species, including water and oxygen.

Although effective to protect the OLED 140 from materials associated with the sealing region 130, the materials of the blocking region 135 are not sufficiently effective to provide long-term protection from species in the exterior environment. Hence, the sealing region 130 is provided, as well as the blocking region 135.

In addition to the above-noted characteristics, the materials selected for the sealing region 130 and blocking region 135 can also be selected based on their flexibility and conformability to other surfaces and their stability during processing (e.g., web-based processing), among others.

In some embodiments of the invention, a gettering material (not shown) is placed proximate the OLED 140. The gettering material acts to capture any moisture, oxygen, etc. that may reach the interior of the device 190 and harm the OLED 140. Preferred gettering materials include CaO and BaO. One particularly preferred product is HICAP2000, a CaO paste obtainable from Cookson SPM.

The OLED 140 can be any OLED known in the art. For example, as noted above, the OLED will generally comprise an anode layer (typically transparent), a cathode layer, and a light-emitting layer (emission layer) disposed between the anode and cathode layer. The light emitting layer can be provided in connection with a number of configurations, including the following: (a) a three-layer configuration comprising a hole transporting layer, an emission layer and an electron transporting layer (i.e., a double heterostructure configuration), (b) a two-layer configuration comprising a hole transporting layer and a layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art.

Although an OLED 140 is shown in connection with the various figures, other organic optoelectronic devices, such as organic electrochromic displays, organic photovoltaic devices and organic thin film transistors, can be used in place of the OLED 140 that is shown.

Like the sealing region 130, the first and second barrier layers 120, 150 act to block the transport of oxygen, water and any other detrimental molecules from the exterior environment. The first and second barrier layers 120, 150 are also typically selected based on one or more additional characteristics, such as flexibility and conformability to other surfaces, dimensional stability during processing (e.g., web-based processing), and adequate bonding with other components. Moreover, at least one of the barrier layers 120, 150 typically permits transmission of light between the OLED and the outside environment. Furthermore, in the embodiment shown, the first barrier layer 120 acts as a support layer for the OLED 140.

Preferred materials for the first and second barrier layers 120, 150 will vary from application to application and include metals, silicon wafers, ceramics and low-permeability polymers.

Metals offer excellent barrier properties, and can be provided in a number of configurations, such as in the form of a metal can and or metal foil, with metal foils being preferred due to ease of manufacture. Preferred metal foils include aluminum, gold and indium, as well as other foils known in the art.

Ceramics also offer low permeability and provide transparency in many cases. Preferred ceramics are glasses, more preferably soda lime and borosilicate glasses.

Polymers are often preferred where optical transparency is desired or where ease of continuous manufacture (e.g., web-based manufacture) is desired. Preferred low permeability polymers include polyesters, polyethersulphones, polyimides and fluorocarbons.

Figure 2:
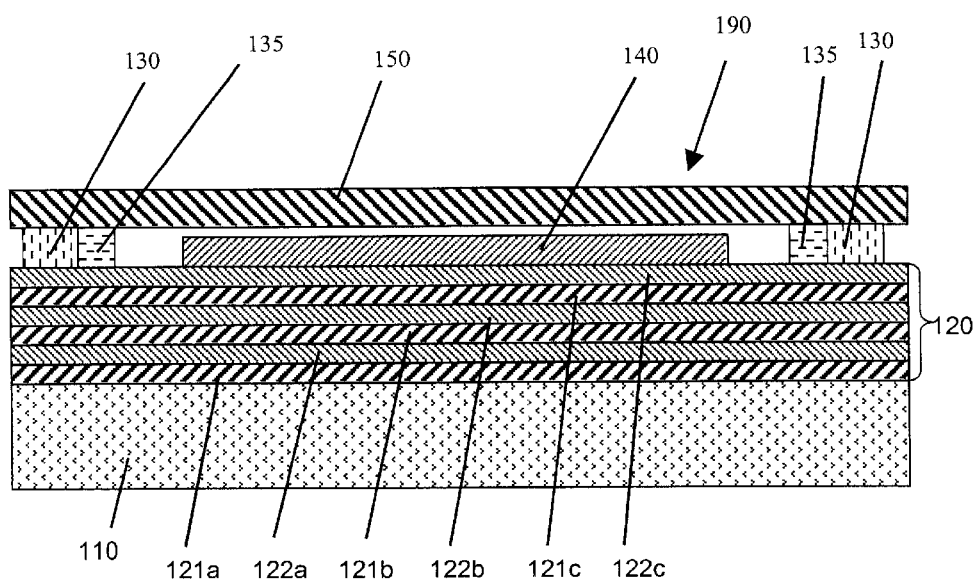
FIG. 2 is a cross-sectional view of an OLED structure in accordance with another embodiment of the present invention.

Composite materials are also among those materials preferred for the first and second barrier layers 120, 150. Referring to FIG. 2, for example, a structure is shown containing a composite first barrier layer 120. In this embodiment, the composite first barrier layer 120 includes a plurality of cooperative barrier sub-layers that include both sub-layers of planarizing material 121*a–c* and sub-layers of high-density material 122*a–c*. These cooperative barrier sub-layers are preferably provided in an alternating configuration. Preferably, 1 to 10 pairs of these sub-layers, more preferably 3 to 7 pairs, are used. Thus, although three alternating pairs are illustrated in FIG. 2, other sub-layer arrangements are possible.

The cooperative barrier sub-layers 121*a–c* and 122*a–c* are disposed on a polymeric substrate sub-layer 110 in the embodiment shown. During manufacture, the substrate sub-layer 110 acts as a foundation upon which the cooperative barrier sub-layers 121*a–c* and 122*a–c* can be laid. Preferred materials for the polymer substrate sub-layer 110 include polyesters, polyethersulphones, polyimides and fluorocarbons that are capable of providing a strong adhesive bond with other materials. Preferred polyesters include polyethylene terephthalate. Preferred fluorocarbon polymers include Aclar® fluoropolymer available from Honeywell. The polymer substrate sub-layer 110 typically ranges from 75 to 625 microns in thickness.

By "planarizing material" is meant a material that forms a smooth planar surface upon application, rather than forming a surface that reflects irregular contours of the underlying surface. Preferred planarizing materials include polymers, such as fluorinated polymers, parylenes, cyclotenes and polyacrylates. Sub-layers of such planarizing materials 121*a–c* can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of outside species, particularly water and oxygen, are hindered. Preferred high-density materials include inorganic materials such as metal oxides, metal nitrides, metal carbides and metal oxynitrides. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. Sub-layers of high-density material 122*a–c* can be applied using techniques known in the art such as thermal evaporation, sputtering, PECVD methods and electron-beam techniques.

Examples of composite barrier layers comprising sub-layers of both high-density material and planarizing material formed on a polymer substrate sublayer are disclosed, for example, in U.S. Pat. No. 5,757,126, the entire disclosure of which is hereby incorporated by reference.

Figure 3:
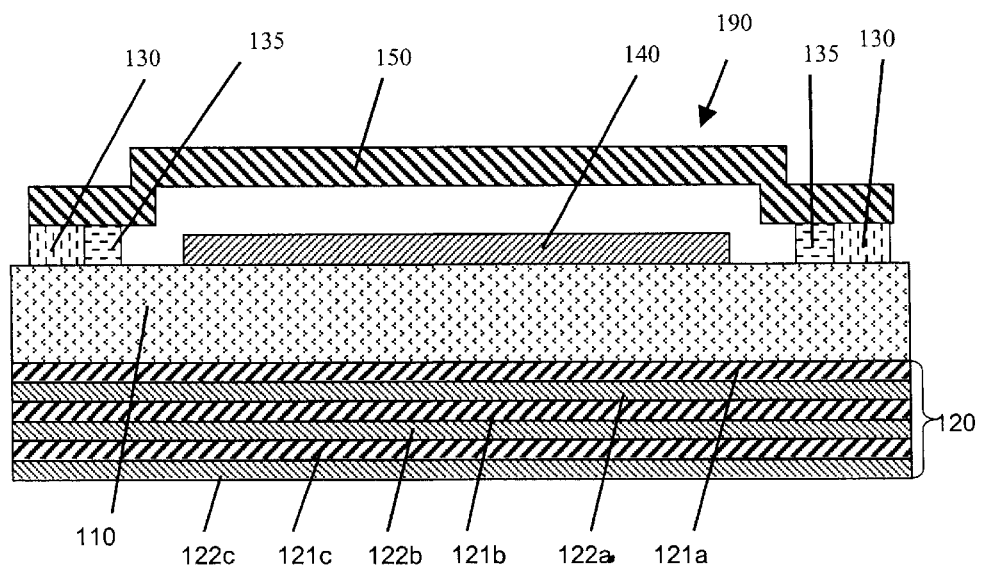
FIG. 3 is a cross-sectional view of an OLED structure in accordance with yet another embodiment of the present invention.

Innumerable further variations on the themes presented above are possible. For example, FIG. 3 illustrates another of these variations. Like FIG. 2, the embodiment of FIG. 3 utilizes cooperative barrier sub-layers 121*a–c* and 122*a–c* disposed on a polymeric substrate sub-layer 110. In the embodiment of FIG. 3, however, the structure is inverted. Also shown in FIG. 3 is the use of a metal can as second barrier layer 150.

Although the present invention has been described with respect to several exemplary embodiments, there are many other variations of the abovedescribed embodiments that will be apparent to those of ordinary skill in the art. It is understood that these variations are within the teachings of the present invention, and that the invention is to be limited only by the claims appended hereto.

What is claimed is:

1. An organic optoelectronic device structure comprising:
   an organic optoelectronic device selected from an organic light emitting diode, an organic electrochromic display, an organic photovoltaic device and an organic thin film transistor;
   first and second barrier layers, at least one of said first and second barrier layers permitting transmission of light between an outer environment and said organic optoelectronic device;
   a sealing region disposed between said first and second baffler layers, said sealing region cooperating with said first and second barrier layers to enclose said optoelectronic device and restrict transmission of water and oxygen from an outer environment to said optoelectronic device, said sealing region comprising an associated material that is harmful to said optoelectronic device, and said sealing region being formed of a material that undergoes a fluid-to-solid phase transformation; and
   a blocking region disposed between said first and second barrier layers and disposed between said sealing region and said optoelectronic device, said blocking region restricting transmission of said associated material from said sealing region to said optoelectronic device.

2. The organic optoelectronic device structure of claim 1, wherein said sealing region is a low viscosity epoxy.

3. The organic optoelectronic device structure of claim 1, wherein said sealing region is a solder region and said associated material comprises solder flux.

4. The organic optoelectronic device structure of claim 1, wherein said sealing region is a two-part epoxy region and said associated material comprises gas released from said epoxy.

5. The organic optoelectronic device structure of claim 1, wherein said blocking region is a curable liquid adhesive.

6. The organic optoelectronic device structure of claim 5, wherein said curable liquid adhesive is a thermally curable epoxy material.

7. The organic optoelectronic device structure of claim 5, wherein said curable liquid adhesive is an ultraviolet-curable epoxy material.

8. The organic optoelectronic device structure of claim 1, wherein said blocking region is a solid adhesive composition.

9. The organic optoelectronic device structure of claim 8, wherein said solid adhesive composition is a two-sided adhesive tape.

10. An OLED device structure comprising: an OLED;
first and second barrier layers, at least one of said first and second barrier layers permitting transmission of light between an outer environment and said OLED;
a sealing region disposed between said first and second barrier layers, said sealing region cooperating with said first and second barrier layers to enclose said OLED and restrict transmission of water and oxygen from an outer environment to said OLED, said sealing region comprising an associated material that is harmful to said OLED, and said sealing region being formed of a material that undergoes a fluid-to-solid phase transformation; and
a blocking region disposed between said first and second barrier layers and disposed between said sealing region and said OLED, said blocking region restricting transmission of said associated material from said sealing region to said OLED.

11. The OLED device structure of claim 10, wherein said sealing region is a solder region and said associated material comprises solder flux.

12. The OLED device structure of claim 10, wherein said sealing region is a two-part epoxy region and said associated material comprises gas released from said epoxy.

13. The OLED device structure of claim 10, wherein said sealing region is a low viscosity epoxy.

14. The OLED device structure of claim 10, wherein said blocking region is a curable liquid adhesive.

15. The OLED device structure of claim 14, wherein said curable liquid adhesive is a thermally curable epoxy material.

16. The OLED device structure of claim 14, wherein said curable liquid adhesive is an ultraviolet-curable epoxy material.

17. The OLED device structure of claim 10, wherein said blocking region is a solid adhesive composition.

18. The OLED device structure of claim 17, wherein said solid adhesive composition is a two-sided adhesive tape.

19. The OLED device structure of claim 10, wherein at least one of said first and second barrier layers is a glass layer.

20. The OLED device structure of claim 10, wherein at least one of said first and second barrier layers comprises a glass sub-layer.

21. The OLED device structure of claim 10, wherein at least one of said first and second barrier layers is a metal layer.

22. The OLED device structure of claim 10, wherein at least one of said first and second barrier layers comprises a metal sub-layer.

23. The OLED device structure of claim 10, wherein at least one of said first and second barrier layers comprises a polymer substrate sub-layer and a plurality of cooperative barrier sub-layers disposed on said polymer substrate sub-layer, said plurality of cooperative barrier sub-layers comprising a planarizing sub-layer and a high-density sub-layer.

24. The OLED device structure of claim 23, wherein said cooperative barrier sub-layers comprise an alternating series of two or more planarizing sub-layers and two or more high-density sub-layers.

25. The OLED device structure of claim 10, wherein at least one of said first and second barrier layers is a silicon layer.

26. The OLED device structure of claim 10, wherein at least one of said first and second barrier layers comprises a silicon sub-layer.

27. The organic optoelectronic device structure of claim 1, wherein said sealing region and said blocking region are in the form of bands between said first and second barrier layer.

28. The OLED device structure of claim 10, wherein said sealing region and said blocking region are in the form of bands between said first and second barrier layer.

* * * * *

UNITED STATES PATENT AND TRADEMARK OFFICE
CERTIFICATE OF CORRECTION

PATENT NO. : 6,614,057 B2
DATED : September 2, 2003
INVENTOR(S) : Jeffrey Alan Silvernail et al.

It is certified that error appears in the above-identified patent and that said Letters Patent is hereby corrected as shown below:

<u>Title page,</u>
Item [57], ABSTRACT,
Line 7, after "between," delete "the".

<u>Column 1,</u>
Line 64, after "between," delete "the".

<u>Column 2,</u>
Line 19, after "layers," delete "are".

<u>Column 5,</u>
Line 18, after "can," change "and or" to -- and/or --.

<u>Column 6,</u>
Line 43, first word, change "baffler" to -- barrier --.

Signed and Sealed this

Eighteenth Day of November, 2003

JAMES E. ROGAN
*Director of the United States Patent and Trademark Office*